United States Patent [19]
Smith et al.

[11] Patent Number: 5,937,517
[45] Date of Patent: Aug. 17, 1999

[54] METHOD OF MANUFACTURING BONDED DUAL EXTRUDED, HIGH FIN DENSITY HEAT SINKS

[75] Inventors: Dean L. Smith, Pittsford; Edmund J. Sobresky, Batavia; Roger S. Kerr, Brockport, all of N.Y.

[73] Assignee: Eastman Kodak Company, Rochester, N.Y.

[21] Appl. No.: 08/967,563

[22] Filed: Nov. 12, 1997

[51] Int. Cl.[6] .................................................. B23P 15/26
[52] U.S. Cl. .......................................... 29/890.03; 29/521
[58] Field of Search ............................... 29/890.03, 458, 29/464, 505, 521, 557; 165/80.3

[56] References Cited

U.S. PATENT DOCUMENTS

| | | |
|---|---|---|
| 4,746,479 | 5/1988 | Hanaki et al. ....................... 29/890.03 |
| 4,777,560 | 10/1988 | Herrell et al. . |
| 4,879,891 | 11/1989 | Hinshaw ............................... 29/890.03 |
| 4,884,331 | 12/1989 | Hinshaw . |
| 5,083,373 | 1/1992 | Hamburgen .......................... 29/890.03 |
| 5,304,846 | 4/1994 | Azar et al. . |
| 5,419,041 | 5/1995 | Ozeki .................................... 29/890.03 |
| 5,428,897 | 7/1995 | Jordan et al. ........................ 29/890.03 |

*Primary Examiner*—Irene Cuda
*Attorney, Agent, or Firm*—Clyde E. Bailey, Sr.

[57] ABSTRACT

A method of manufacturing a high performance, high fin density heat sink (10) uses extruded first and second base elements having an alternating arrangement of closely spaced fins and recesses for receiving opposing fins. The fins in the first and second base elements are bonded to the recesses formed in the common face of the opposing base element to form the bonded extruded heat sink.

8 Claims, 8 Drawing Sheets

METHOD OF MANUFACTURING BONDED DUAL EXTRUDED, HIGH FIN DENSITY HEAT SINKS

FIELD OF THE INVENTION

The invention relates to heat sinks, more particularly, the invention concerns a method of manufacturing bonded, extruded heat sinks having high fin density enabling superior thermal performance.

BACKGROUND OF THE INVENTION

Existing high performance heat sinks are characterized by a high fin density design, i.e., a fin population about twice that which can be normally produced in a standard production process. In this case, the surface area has a major influence on the overall heat transfer capability of the heat sink. Additionally for existing heat sinks having tightly spaced fins, the heat transfer coefficient is determined by the hydraulic diameter of the heat sink design. Hydraulic diameter is generally defined in the art as four times the area of the channel (i.e., space or distance between adjacent fins) divided by the perimeter of the channel. Thus, the smaller the hydraulic diameter, the higher both the heat transfer coefficient and the heat transfer of the heat sink.

One such design is illustrated in U.S. Pat. No. 4,777,560 by Herrell et al. in which a high performance, high fin density heat sink is described. According to Herrell et al., various alternative heat sink construction techniques are described that produce high fin density design. An inherent disadvantage of the design is the inability to maximize the surface area of each individual fin. Approximately 25% to 33% of the potential individual fin surface area is not available, as this area is in contact with the adjacent fin (See for instance Herrell et al, FIGS. 1, 2, 3 and 4). In addition, heat sinks based on FIGS. 1 and 2 in Herrell et al have an internal plenum that further decreases available surface area for a given volume of a heat sink design. Thus, Herrell et al. does not teach maximizing heat sink surface area, for a given heat sink volume.

In U.S. Pat. No. 5,304,846 to Azar et al., a heat sink design is disclosed that maximizes fin surface area in a high performance, high fin density heat sink. According to Azar et al., the manufacturing techniques disclosed are crystal-orientation-dependent etching, precision sawing, electric discharge machining, or numerically controlled machining. A major shortcoming of the Azar et al. heat sink design is that they are generally difficult to manufacture. Additionally, the Azar et al. heat sink requires enormously high production cycle time to manufacture which, of course, makes them cost ineffective.

In U.S. Pat. 4,884,331 by Hinshaw, a method of manufacturing a pin-finned heat sink from an extrusion is described. According to the cross cut machine method disclosed in Hinshaw, the maximum pin fin density that can be achieved is limited to what is obtainable by an extrusion process. This latter limitation clearly would not be acceptable in the heat sink design of the present invention. Another shortcoming of Hinshaw is that only square or rectangular pin fins can be manufactured, no round or elliptical profiles are available.

Moreover, there exists various heat sink manufacturers that offer bonded fin heat sink assemblies in which each fin in the assembly is individually bonded into a heat sink base. (See for instance, catalogue material on Augmented surface Bonded Heat Sinks published by AAVID™ Thermal Technologies, Inc. (March 1996). A major shortcoming, however of the AAVID™ heat sinks is their enormously high cost. This cost is related directly to the labor required to individually arrange each fin on some sort of support or substrate and high production cycle time.

Therefore, a need persists for a high performance, method of manufacturing a high fin density, bonded extruded heat sink that maximizes heat sink surface area and is cost effective and simple to produce.

SUMMARY OF THE INVENTION

It is, therefore, an object of the invention to provide a method of manufacturing a dual bonded fin heat sink that has a high fin density and a plurality of fluid flow channels defined by the top and bottom fins of the two separate heat sinks.

Yet another objective of the invention is to provide a method of manufacturing a high density, high performance heat sink.

Still another object of the invention is to provide a method of manufacturing a high performance, high fin density heat sink that is cost effective.

Yet another object of the invention is to provide method of manufacturing an extruded heat sink that has a plurality of integral ducts or fluid channels for the heat sink for insuring that all air flow goes through the heat sink with no air by-pass.

To overcome one of more problems in the prior art, there is provided a method of manufacturing a thermally efficient heat sink which includes providing an extrusion die for extruding a first element and a second element. First and second elements are extruded from the die such that the first element has a plurality of vertically extending first fins and recesses arranged in a common first face and the second element has a plurality of vertically extending spaced second fins and a plurality of second recesses arranged in a common second face. The extruded first and second elements are then sized to a predetermined dimension. After the first and second elements are sized they are then aligned so that the common first face of the first element opposes the common second face of the second element. In this way, the first fins are aligned for being received by the second recesses and the second fins are aligned for being received by the first recesses. A bonding layer, such as a thermally conductive epoxy, is then applied to either of the first and second recesses and the first and second fins. Thereafter, the first and second fins are pressed into an aligned respective first and second recess channels forming an extruded high fin density heat sink having gas passageways defined by spaces between first and second fins.

It is, therefore, an advantageous effect of the method of manufacturing of the invention that a high thermally efficient heat sink formed by extruding the first and second elements each having first and second fins and recesses for receiving an end portion of the fins in a bonded relations is cost effective and efficiently manufactured. It is another advantage of the invention that compared to prior art heat sinks that have each individual fin being bonded to the heat sink base, the present invention has ½ as many bonded joints, leading to improved heat transfer as well as increased structural performance.

BRIEF DESCRIPTION OF THE DRAWINGS

The foregoing as well as other objects, features and advantages of this invention will become more apparent from the appended Figures, wherein like reference numerals denote like elements, and wherein.

DETAILED DESCRIPTION OF THE INVENTION

Figure 1A:
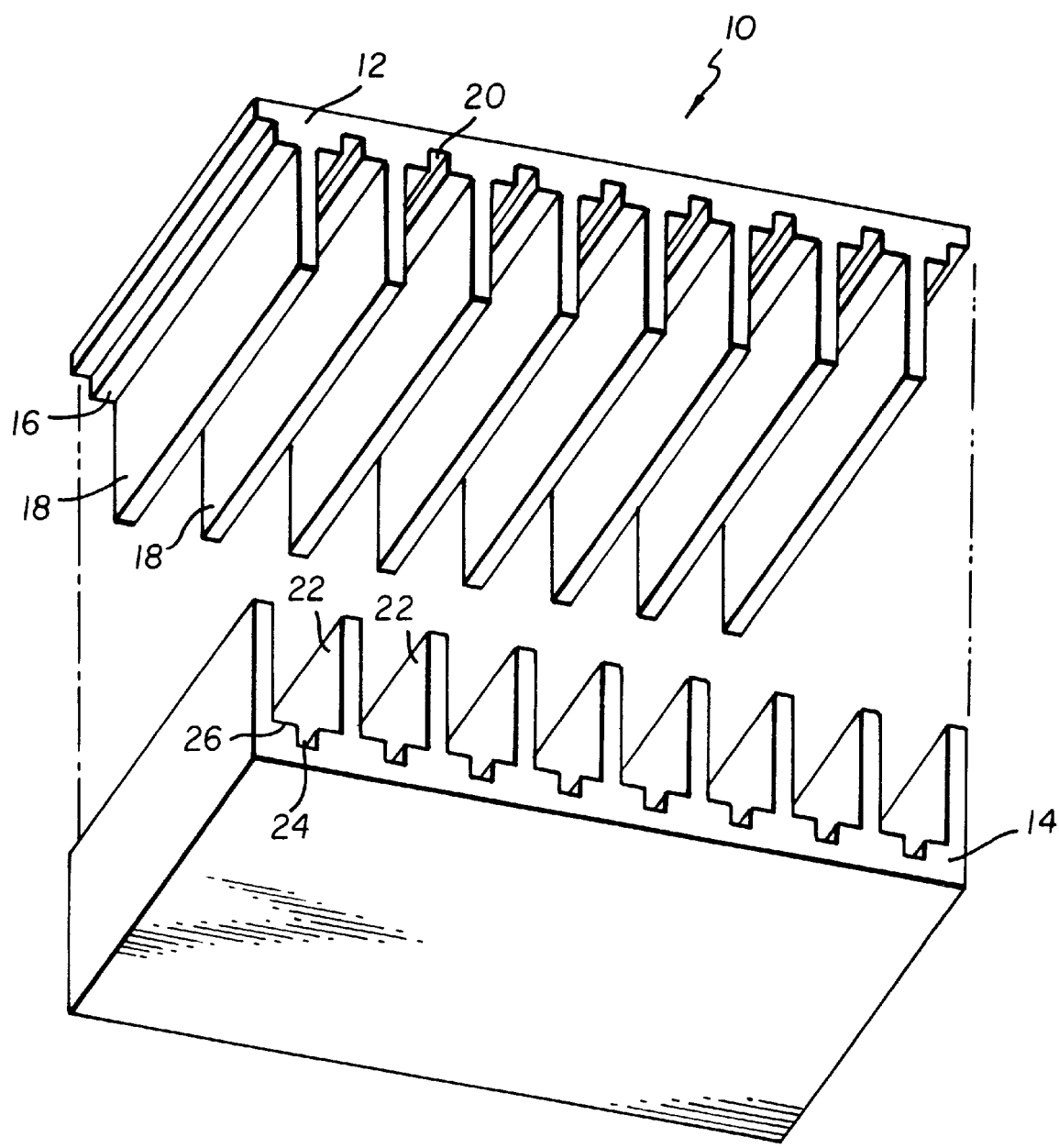
FIGS. 1A and 1B are exploded schematic views of the heat sink of the invention illustrating the two extruded elements.

Turning now to the drawings, and more particular to FIGS. 1–5, there is illustrated the extruded, high fin density heat sink 10 manufactured in accordance with the principles of the invention. More particularly, heat sink 10 includes an extruded first and second base element 12, 14. As best seen in FIG. 1A, extruded first base element 12 has a common first face 16 that accommodates a plurality of vertically extending, substantially parallel, spaced first fins 18. Between nearest adjacent spaced first fins 18 is formed a first recess channel 20 which extends lengthwise between the adjacent first fins 18. Similarly, as best seen in FIG. 1B, extruded second base element 14 includes a common second face 26 that accommodates a plurality of vertically extending, substantially parallel, spaced second fins 22. A plurality of similar second recess channels 24 formed in the common second face 26 are alternatingly arranged between adjacent second fins 22.

Figure 2:
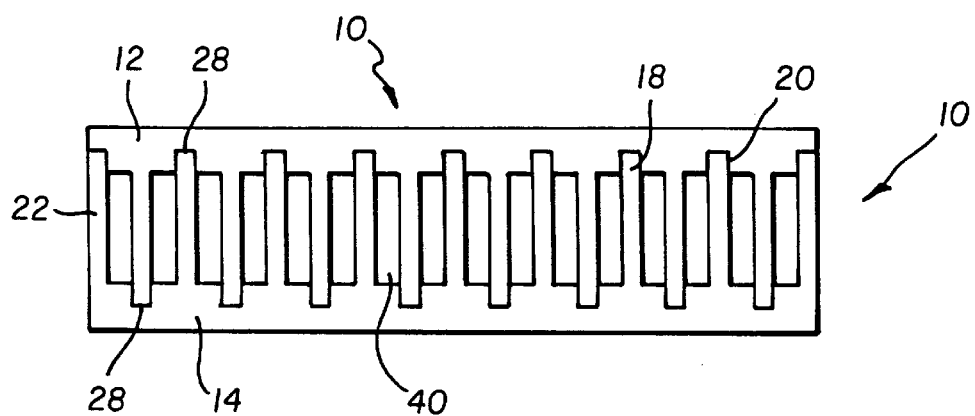
FIG. 2 is a front view of heat sink elements showing the fins and recessed channels that are used to position and bond the fins into the opposed element.

Illustrated in FIG. 2, a plurality of fluid flow passageways 40 formed between nearest adjacent first and second fins 18, 22 in the bonded first and second base elements 12, 14 of heat sink 10 enable fluid, such as heated air from a heat generating body (not shown) to pass during thermal cooling.

Thus, according to a preferred embodiment of the invention, a method of manufacturing an extruded high fin density heat sink 10, as described above, includes the step of providing an extrusion die (not shown) to manufacture extrusions for forming first and second base elements 12, 14. We prefer using a hot extrusion process using typical operating conditions, i.e., temperature and pressure, corresponding to the stock or materials being extruded. Extrusions formed during the extrusion process are then transformed during successive steps (described below) into a first base element 12 and a second base element 14.

First and second base elements 12, 14 may be extruded from a variety of commercially available thermally conductive nonferrous stock or materials, for instance, zinc alloys, copper, copper alloys, magnesium, aluminum, and a mixture thereof. For instance, the following are approximate temperature ranges for some stock materials that may be used in the method of the invention: aluminum, 1000–1100 degrees F.; copper, 1200–2000 degrees F. In our preferred embodiment we used copper alloys which have the advantage of high thermal conductivity.

Typically, extrusion dies of the type used to form base elements 12, 14 are made of hardened H-13 tool steel. The shape and size of the base elements, as described, are wired electro discharge machines cut into the die. Detailed features of the first and second base elements 12, 14 are sized in accordance with known shrinkage parameters and with an angular relief cut into the backside of the die to facilitate the extrusion process. The extrusion die is configured, along with a back-up die, to fit into a conventional extrusion press of suitable tonnage for the size and weight of the base element. Thus, preferably heat sink 10 having generally planar base elements 12, 14 with a plurality of substantially parallel first and second fins 18, 22 (as discussed above) extending from a respective common face 16, 26 is extruded by employing an extrusion die (as described) and an extrusion press of suitable size and tonnage.

Important detail features of the first and second elements 12, 14 include the thickness of the fins and spacing between nearest adjacent fins in each element. Also important are the plurality of spacings between nearest adjacent first and second fins 18, 22 in the bonded first and second elements 12, 14. In part, this latter feature is determined by the strength of the die materials and extrudeability of the alloy selected for extrusion. For common aluminum 6061 and 6063 alloys, we prefer a ratio of fin thickness to fin height of about 10/1 where the fin thickness is about 0.050 inches (1.27 mm) at the tip or top end portion that is inserted in the recess in the opposing common face . Preferably, the spacing is about 3½ to 4 times the thickness of the fins. We have found that fins 18, 22 should have taper for maximum produceability, about ⅕ the fin thickness at the tip per side. The practical limit for fin thickness is about 0.050 inches at the tip 42.

Moreover, first and second base elements 12, 14 of heat sink 10, having our preferred dimensions and features (described above), are then extruded from the extrusion die. The base elements 12, 14, after having been extruded, are then assembled in accordance with the steps of the invention, further discussed below.

Skilled artisans will appreciate that the extrusion process (not illustrated), described in greater details below, itself is the culmination of a series of pre-planned and scheduled functions. Billets of the alloy used for the base elements 12, 14 are purchased from one of a large variety of vendors, such as Alcan, Shawinigan, Quebec. The billets may be cut from longer logs of stock material or manufactured to specification, i.e., to the proper size, by the extruders. As is well know in the art, extrusion presses range from 50 tons to 8,000 tons. Billets can be from 2 inches in diameter to 24 inches in diameter. Billets are preheated to approximately 1000 degrees F., depending on the aluminum alloy to be extruded, and then fed into the container of the extrusion press. Prior to preheat, however, the extrusion die and back-up die are preferably preheated and placed ahead of the container in the die ring that holds the die and the die back-up block.

During the extrusion process (not illustrated), a ram, with dummy block in front, advances the billet against the extrusion die. Because this is a closed container under high pressure, the hot aluminum metal will be extruded out through the die opening resulting in a length of extrusion the shape of the preferred extrusion die.

As will be appreciated by those skilled in the art, as the extrusion emerges from the die, an auxiliary piece of equipment, sometimes referred to as a puller, will grasp the end of the extrusion and exert a degree of tension on the extrusion to keep it straight as it travels down the length of the run out table (a series of graphite blocks that guide the extrusion). The length of the extrusion is determined by the length of the run out table or the ratio of the volume of the extrusion to the volume of the billet. At this length, the billet is cut and then allowed to cool to room temperature on the run out table.

The ram (not shown) will stop short of the die by about 3 inches creating a butt or unextended billet. At this point the container and ram back off from the unextended billet which is then sheared off for further processing. The container is moved forward, another billet is loaded into the container and the process begins again.

Subsequently, after the lengths of extruded material are cooled, they are transferred to a stretcher where each end is grasped and the length is stretched up to 3% thereby minimizing the volumetric stresses and distortions in the extruded material. The lengths are then cut using cut-off saws to processing size lengths that can readily be further processed, including heat treatments, or cut to intermediate or final dimensional size.

After extruding, the extruded first base element 12 and the second base element 14 are then sized to a predetermined dimension to accommodate a particular application. Once the base elements 12, 14 are dimensionally sized, they are then transferred to a saw operator where a cut-off saw sizes the part to its final sized length or to an intermediate sized length. Dimensionally sizing base elements 12, 14 can be accomplished with any conventional means such as grinding, machining, etc. If very accurate fine sized lengths are required, the intermediate sized lengths parts may be further sized to final size length by a variety of means such as milling, computer numerically controlled (CNC) machining, or grinding. Final sized lengths are deburred using vibratory tumbling, hand deburring or semi-automatic brush-a-lon deburring equipment.

In alternative embodiments of the method of the invention, other advantageous features of the heat sink 10, such as flat mounting surfaces, slots, drilled & tapped holes, etc. manufactured by the steps of the invention, may be incorporated by use of secondary operations, typically milling, CNC machining, turning or piercing to complete each part to its final specifications. These are conventional steps that can be implemented within the contemplation of the invention.

Figure 3A:
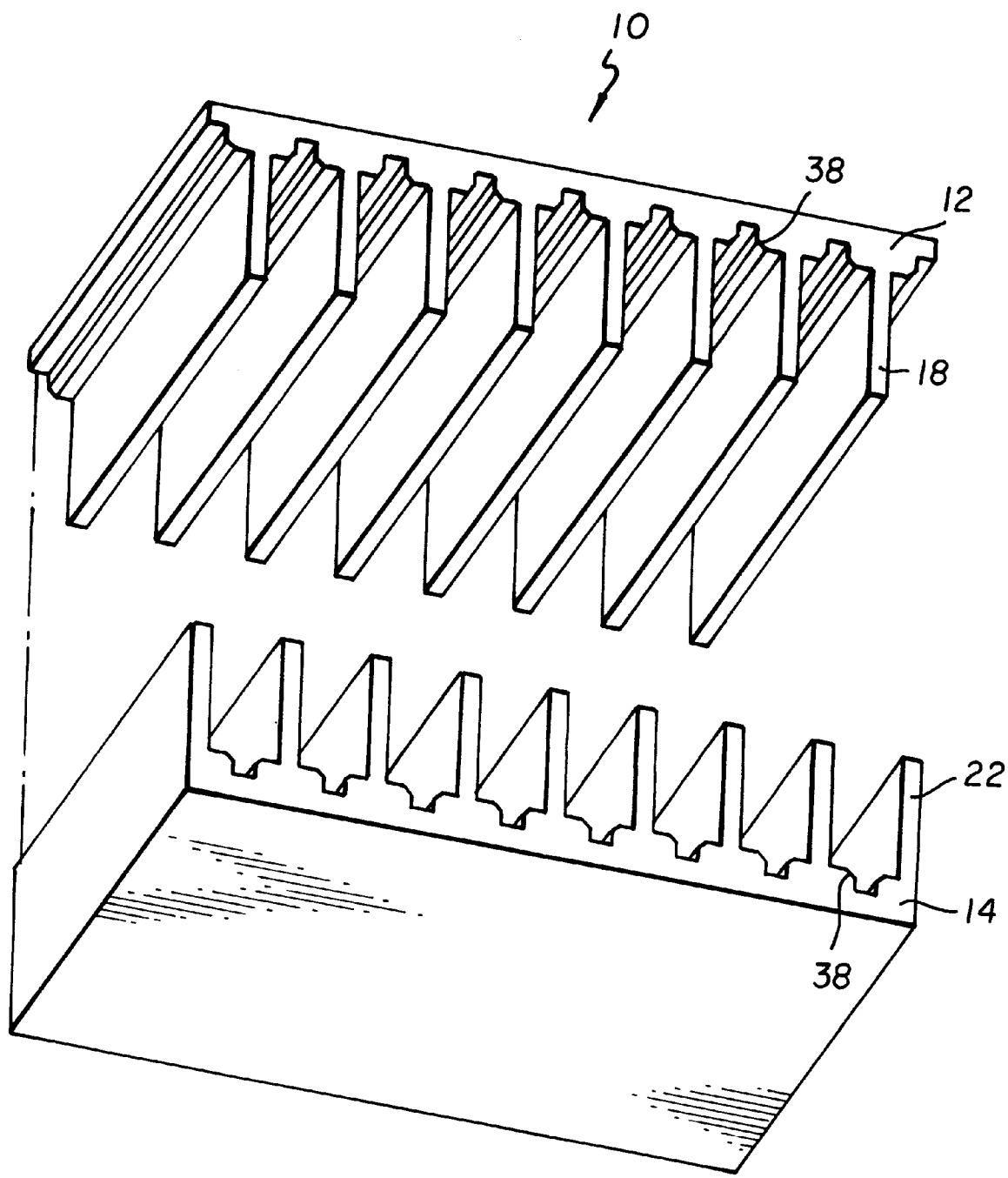
FIGS. 3A and 3B are exploded schematic views of the heat sink manufactured in accordance with the steps of the invention illustrating the two extruded elements with chamfered recesses to assist guiding the elements during assembly.
Figure 3B:
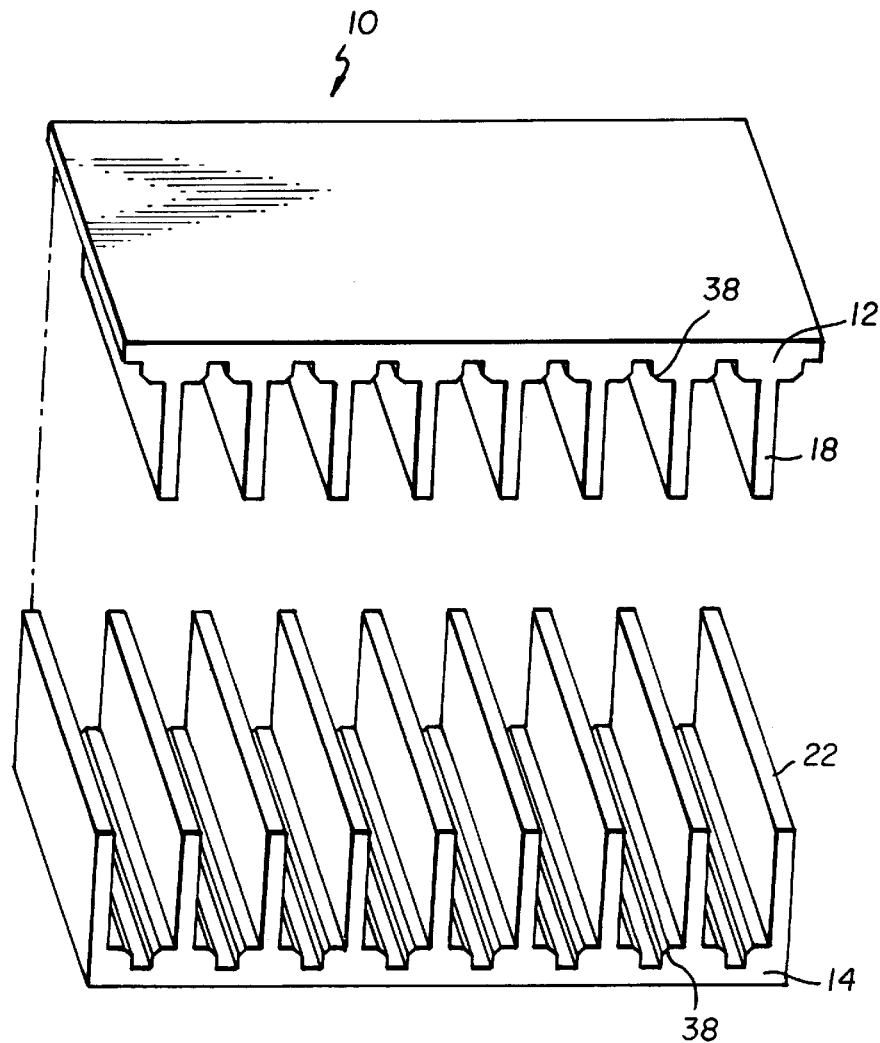
Figure 4:
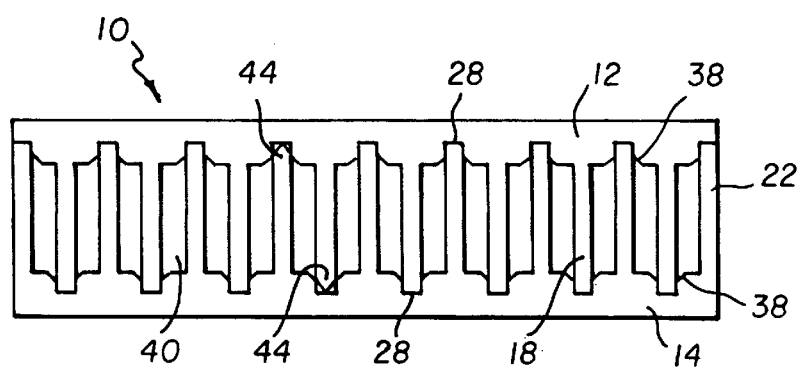
FIG. 4 is a front view of the heat sink elements showing the fins and chamfered recess channels that are used to position and bond the fins into the opposed element.
Figure 7A:
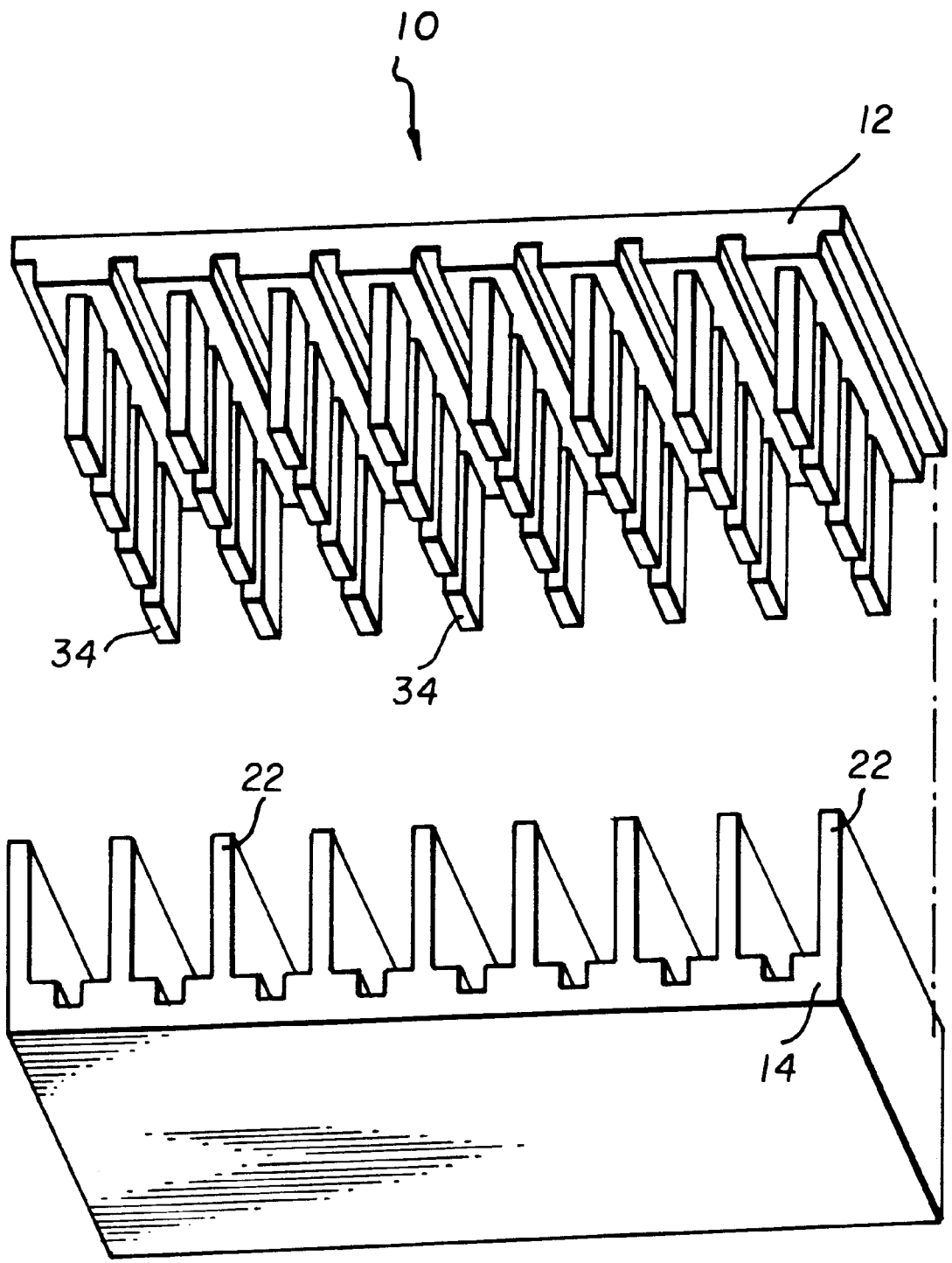
FIGS. 7A and 7B are exploded views illustrating only the plurality of first fins being cross cut and air flow shields formed by the two outermost of the plurality of second fins; and, FIG. 7C is a front view of the heat sink elements shown in FIGS. 7A and 7B.
Figure 7B:
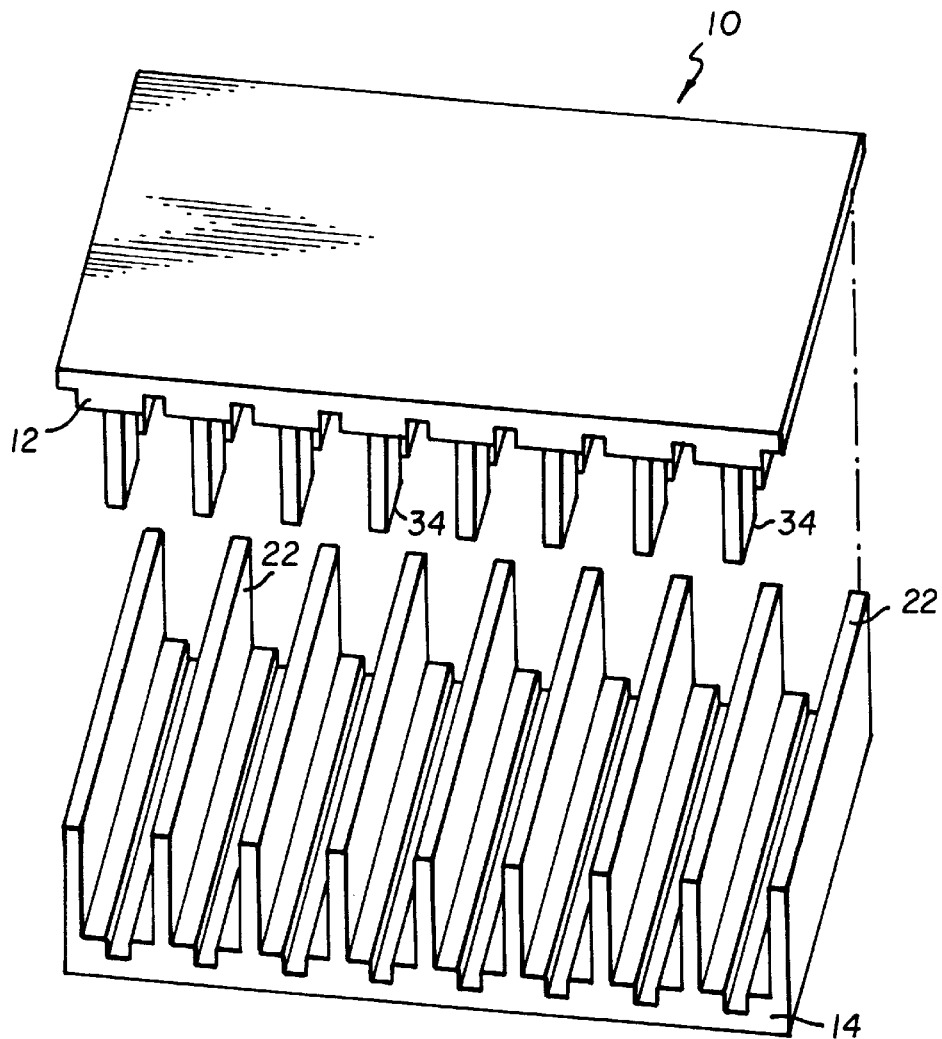
Figure 7C:
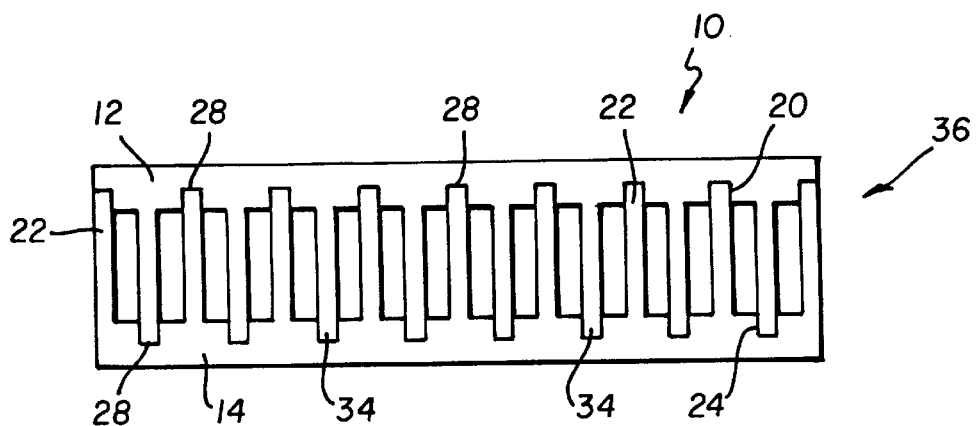

Referring FIG. 3A and FIG. 3B prior to applying a bonding layer 28 (described below), to bond the first base element 12 to the second base element 14, an alternative intervening step may be instituted. We prefer including the step of cross cutting the base elements 12, 14 so as to form a plurality of substantially rectangular shaped first pin fins 18 and rectangular shaped second pin fins 22. Cross cutting is typically performed by milling or use of keyway cutters so as to form a plurality of substantially rectangular fins 34 as shown in FIGS. 6A–6B and 7A–7C. Cross cutting enhances the heat transfer from fins 18, 22 into the air by breaking up the boundary layers that form along the surface of said fins 18, 22. A closed sided heat sink 36 will contain and direct the fluid flow (FIG. 7C).

Figure 1B:
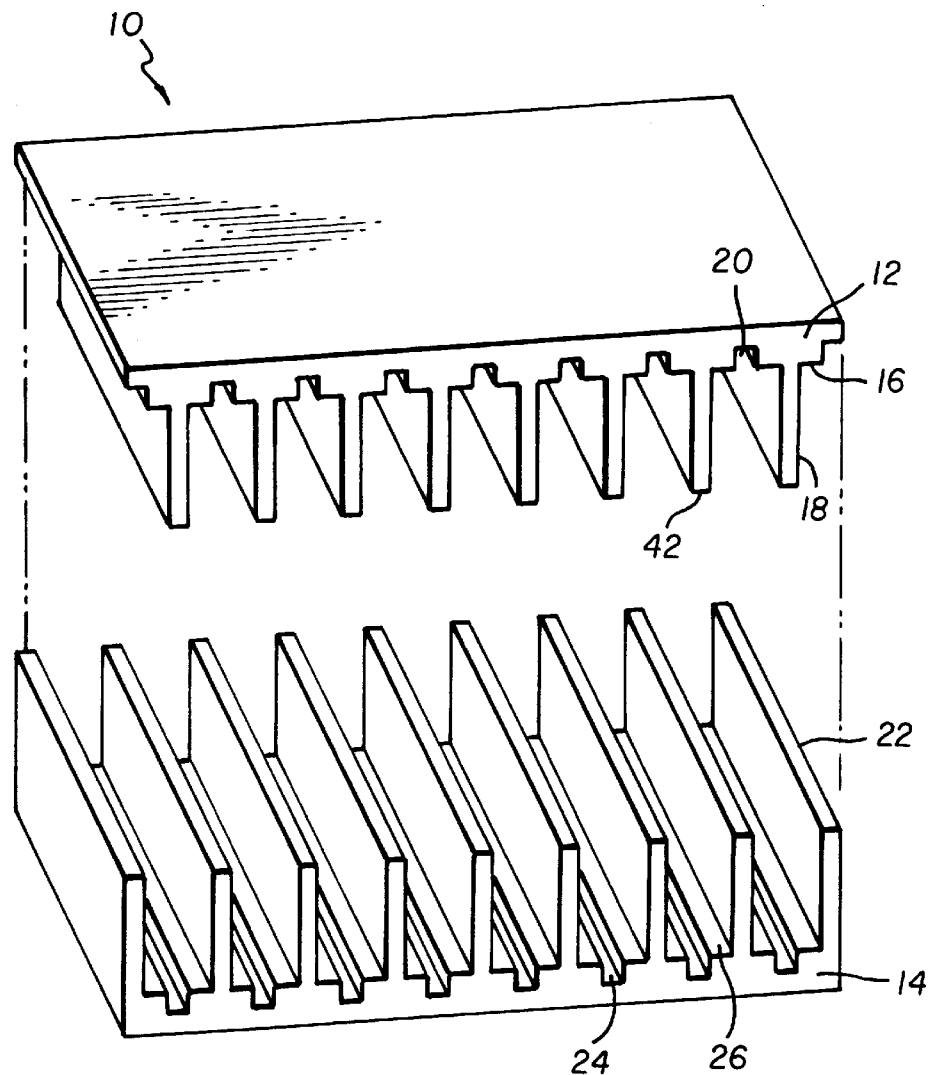

Referring to FIGS. 1A and 1B, the common first face 16 of the first base element 12 is aligned with the common second face 26 of the second base element 14. In this way, first fins 18 of first base element 12 are aligned for being pressed into the second recess channels 24 in opposed second base element 14. Likewise, the second fins 22 of opposed second base element 14 are aligned for being pressed into the first recess channels 20 of first base element 12.

Precise alignment of the first and second base elements 12, 14 for assembly includes locating and orienting the first base element 12 relative to the opposed second base element 14. Skilled artisans will appreciate that alignment of the elements 12, 14 prior to assembly can be accomplished through various ways, such as with dowel pins, bushings arranged in a fixture. Moreover, those skilled in the art will further appreciate that alignment can be achieved through automatic or manual manipulation of the base elements 12, 14, or making use of (shown in FIG. 3A) to assist in alignment.

Once the base elements 12, 14 are aligned, as discussed above, they are bonded together with a bonding layer 28 (FIG. 4), preferably by applying an epoxy resin to either the top portions of fins 18, 22 and the first and second recess channels 20, 24. This process may be accomplished either automatically or manually using calibrated and precise dispensing devices. We prefer automatic dispensing in the interest of reduced cycle time and cost. Moreover, although any suitable bonding material may be used, we prefer using an epoxy resin having the highest thermally conductive rating available that sets up in a reasonable time span, such as the thermally conductive Epoxy Adhesive made by Thermalloy, Inc.

Figure 5:
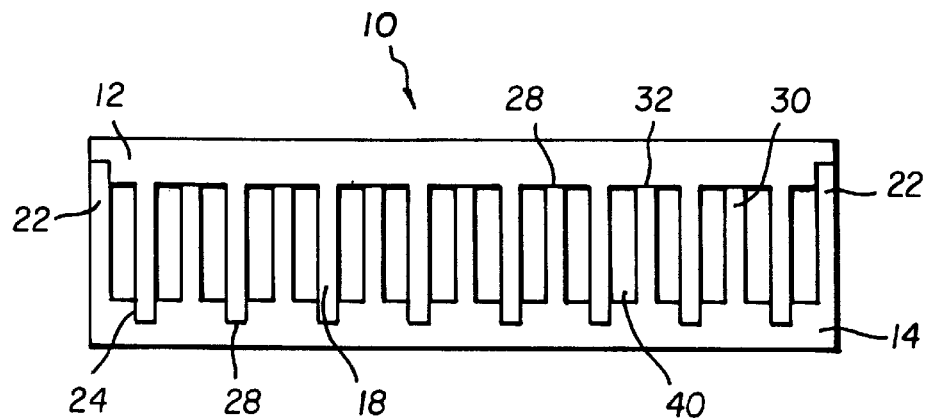
FIG. 5 is a front view of an alternative heat sink embodiment manufactured using the steps of the invention, having first fins positioned in recess channels and second fins abut the first face.
Figure 6A:
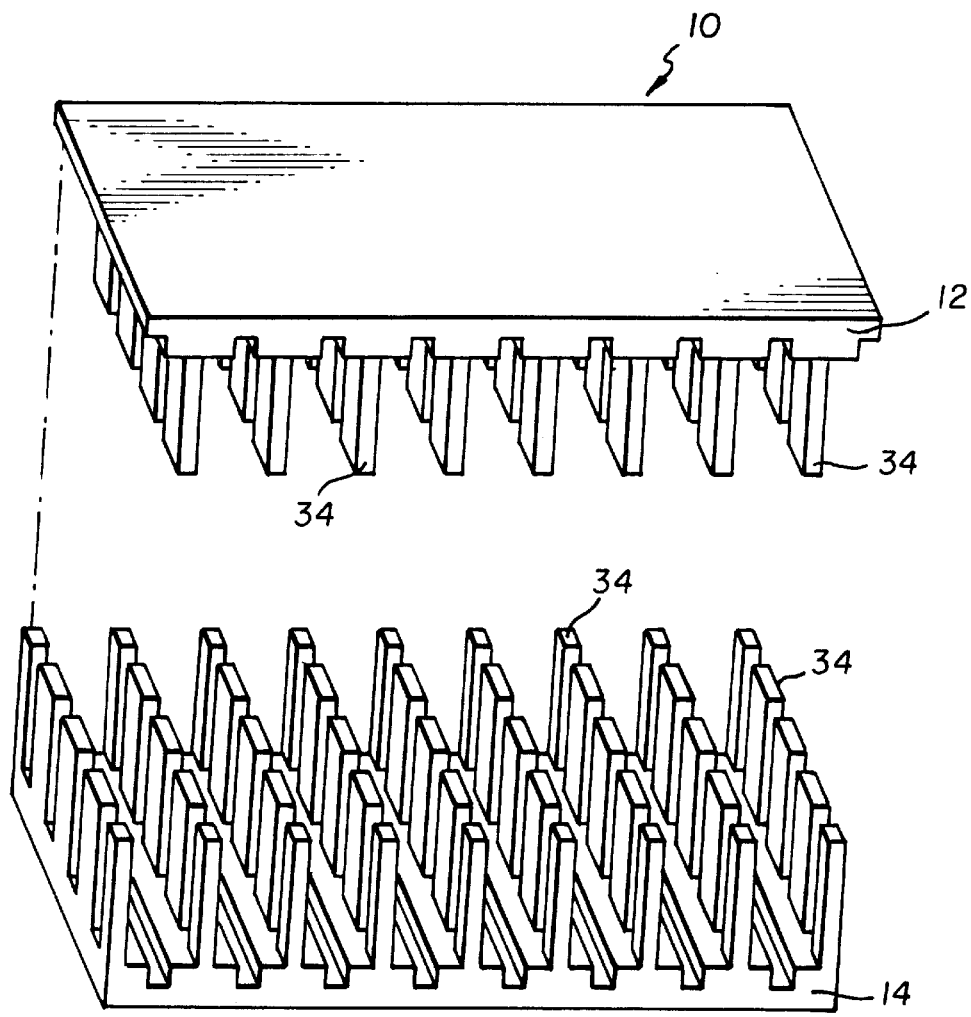
FIGS. 6A and 6B are exploded perspective views of a heat sink made in accordance with the steps of the invention having cross cut first and second fins.
Figure 6B:
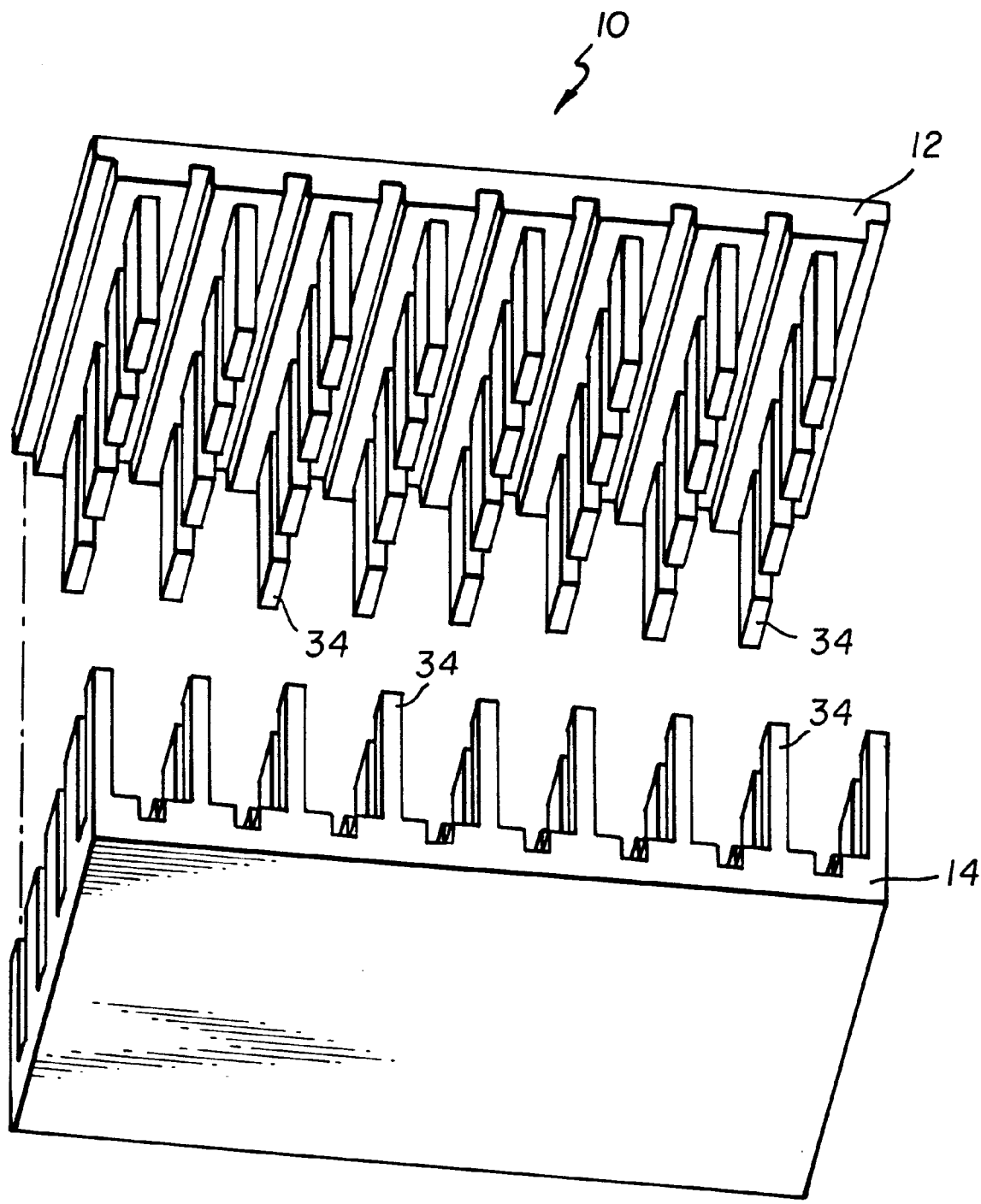

While the thickness of the bonding layer and the application procedure is not critical to the invention, we followed the principle that it is desirable to produce an assembly that is economical to manufacture. Thus, we preferred applying the epoxy resin only on the top end portions or tips 42, (FIG. 1B) of the fins 18, 22 to accommodate ease of assembly. This bonding practice was followed whether it was preferable to bond the first and second fins 18, 22 in opposing recesses 20, 24 (as discussed above) or, alternately, to bond the first and second fins 18, 22 flush against the planar common face of the opposing base element. This type butt joint is illustrated in FIG. 5 showing butt joint fins 30, and butt joint 32 with bonding layer 28.

Before the bonding resin has a chance to dry, the first and second fins 18, 22 are firmly pressed into an aligned respective first and second recess channels 20, 24. This practice facilitates the bonding process and provides more bonding strength between the extruded elements 12, 14.

As the extruded first and second base elements 12, 14 are assembled, pressure may be applied to the opposing elements 12, 14 which would urge into precise alignment any of the first and second fins 18, 22 which may not be properly aligned. This is done through the self-aligning chamfered ends 44 provided on the tip of the fins 18, 22 and the self aligning chamfered recesses 38. Depicted in FIG. 4, chamfered edges are preferably between 20 degrees and 30 degrees on each side to assure ease of entry of each of the fins 18, 22 into the opposed chamfered recesses 38. For low volume assembly the above could be done manually with a minimum of tooling.

While the invention has been described with a certain degree of particularity, it is manifest that many changes may be made in the details of construction and the arrangement of components without departing from the spirit and scope of this disclosure. It is understood that the invention is not limited to the embodiment set forth herein for purposes of exemplification, but is to be limited only by the scope of the attached claims, including the full range of equivalency to which each element thereof is entitled.

PARTS LIST

10 .... assembled heat sink (FIG. 2)
12 .... first base element
14 .... second base element
16 .... common first face
18 .... first fins
20 .... first recess channel
22 .... second fins
24 .... second recess channel
26 .... common second face
28 .... bonding layer
30 .... butt joint fins
32 .... buttjoint
34 .... substantially rectangilar
36 .... closed sided heat sink assembly
38 .... chamfered recesses
40 .... fluid flow passageways
42 .... fin tips
44 .... chamfered ends

What is claimed is:

1. Method of manufacturing an extruded high fin density heat sink, comprising the steps of:

(a) providing an extrusion die for extruding billets defined as first and second base elements;

(b) extruding said first and second base elements, wherein said first base element has a plurality of spaced first fins and first recesses formed in a common first face, and wherein said second base element has a plurality of spaced second fins and second recesses formed in a common second face;

(c) sizing said extruded first and second base elements to a predetermined dimension;

(d) aligning said common first face of said first base element with said common second face of said second base element such that said first fins are aligned for being received by said second recesses and said second fins are aligned for being received by said first recesses;

(e) applying a bonding layer to either of said first and second recesses and said first and second fins; and, (f) pressing each of said first and second fins into an aligned respective first and second recess thereby forming an extruded heat sink having gas passageways defined by spacing between nearest adjacent first and second fins bonded in the first and second elements.

2. The method recited in claim 1, wherein after step (b) and prior to step (c), further comprising the step of machining said first and second base elements.

3. The method recited in claim 1 wherein prior either of steps (c) and (d), further comprising the step of cross cutting said first and second base elements so as to form a plurality of substantially rectangular fins.

4. The method recited in claim 1, wherein said step of extruding includes the step of chamfering end edges on said recesses and end edges of said fins for guiding each of said fins into a respective recess.

5. The method recited in claim 1 wherein after step (f), further comprising the step of simultaneously applying pressure to said first and second base elements to promote bonding of said first and second fins in their respective second and first common face.

6. The method recited in claim 1 wherein before step (c), further comprising the step of cross cutting the first and second plurality of fins to form generally rectangular pin fins.

7. The method recited in claim 1 wherein before step (c), further comprising the step of cross cutting any one of the first and second plurality of fins.

8. The method recited in claim 7, wherein said aligning step (d) further includes the step of arranging fins of said one of the first and second plurality of fins so that the two outermost fins on the perimeter of the heat sink form air flow shields for directing air through the air flow channels.

* * * * *

UNITED STATES PATENT AND TRADEMARK OFFICE
CERTIFICATE OF CORRECTION

PATENT NO. : 5,937,517
DATED : August 17, 1999
INVENTOR(S) : Dean L. Smith, et al.

It is certified that error appears in the above-identified patent and that said Letters Patent is hereby corrected as shown below:

Column 1, last line:
insert -- ) -- after "March 1996)"

Column 6, line 19:
after "making use of" insert --chamfers 38--

Column 7, in the Parts List, at identifying part number 34:
after "substantially" delete "rectangilar" and insert --rectangular fins--

Signed and Sealed this

Eleventh Day of April, 2000

Attest:

Q. TODD DICKINSON

*Attesting Officer*      *Director of Patents and Trademarks*